United States Patent
Park

(10) Patent No.: US 8,421,948 B2
(45) Date of Patent: Apr. 16, 2013

(54) BACKLIGHT UNIT

(75) Inventor: Sang Jae Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 443 days.

(21) Appl. No.: 12/656,508

(22) Filed: Feb. 1, 2010

(65) Prior Publication Data

US 2010/0201904 A1  Aug. 12, 2010

(30) Foreign Application Priority Data

Feb. 12, 2009  (KR) .................. 10-2009-0011382

(51) Int. Cl.
*G02F 1/1333* (2006.01)
(52) U.S. Cl.
USPC ............................................. 349/58; 349/60
(58) Field of Classification Search ............ 389/58; 349/60
See application file for complete search history.

(56) References Cited

U.S. PATENT DOCUMENTS

| | | | | |
|---|---|---|---|---|
| 7,374,306 B2* | 5/2008 | Liu | | 362/27 |
| 8,147,113 B2* | 4/2012 | Hamada | | 362/631 |
| 2006/0023448 A1* | 2/2006 | Mok et al. | | 362/231 |
| 2006/0187660 A1* | 8/2006 | Liu | | 362/294 |
| 2007/0009210 A1* | 1/2007 | Hulse | | 385/88 |
| 2007/0053165 A1* | 3/2007 | Hsu | | 361/715 |
| 2007/0103939 A1* | 5/2007 | Huang et al. | | 362/633 |
| 2007/0211205 A1 | 9/2007 | Shibata | | |
| 2007/0230173 A1 | 10/2007 | Kim | | |
| 2007/0247564 A1* | 10/2007 | Takahashi | | 349/65 |
| 2008/0055534 A1* | 3/2008 | Kawano | | 349/161 |
| 2008/0111949 A1* | 5/2008 | Shibata et al. | | 349/64 |
| 2009/0073346 A1* | 3/2009 | Mikami | | 349/65 |
| 2009/0190063 A1* | 7/2009 | Nagaoka et al. | | 349/58 |
| 2009/0237916 A1 | 9/2009 | Park | | |
| 2009/0279300 A1 | 11/2009 | Okajima et al. | | |
| 2009/0316432 A1* | 12/2009 | Nittou | | 362/612 |
| 2010/0073959 A1* | 3/2010 | Hamada | | 362/611 |
| 2011/0110045 A1* | 5/2011 | Nagaoka et al. | | 361/707 |

FOREIGN PATENT DOCUMENTS

| | | |
|---|---|---|
| EP | 1 785 764 | 5/2007 |
| EP | 2 101 360 | 9/2009 |
| JP | 2009180932 A * | 8/2009 |
| WO | WO 2008078587 * | 5/2007 |
| WO | WO 2008/078587 | 7/2008 |

* cited by examiner

*Primary Examiner* — Kaveh Kianni
(74) *Attorney, Agent, or Firm* — McKenna Long & Aldridge LLP

(57) ABSTRACT

A device and a backlight unit includes a bottom cover; a module substrate on the bottom cover; at least one light emitting diode on the module substrate; and a fastening unit fastening the module substrate to the bottom cover.

20 Claims, 2 Drawing Sheets

BACKLIGHT UNIT

The present application claims priority under 35 U.S.C. 119 and 35 U.S.C. 365 to Korean Patent Application No. 10-2009-0011382 filed on Feb. 12, 2009, which is hereby incorporated by reference in its entirety.

BACKGROUND

With the development of the electronic industries, various display devices having various sizes with low energy consumption have been developed. A liquid crystal display (LCD) has been developed for the purpose of extensively being used as a display device for a monitor, a television, and a mobile communication terminal.

Since the LCD itself does not emit light, the LCD includes a backlight unit as a light source for supplying light from a rear side of an LCD panel. The backlight unit generates white light so that images displayed on the LCD panel may have colors substantially identical to original colors of the image.

SUMMARY

The embodiment provides a backlight unit capable of preventing a position or a shape of a module substrate from being changed or deformed by fastening the module substrate, on which a light emitting diode is packaged, closely to a bottom cover.

In addition, the embodiment provides a backlight unit capable of efficiently dissipating heat generated during operation of the light emitting diode.

DETAILED DESCRIPTION OF THE EMBODIMENTS

Hereinafter, a backlight unit according to the embodiments will be described in detail with reference to accompanying drawings.

Figure 1:
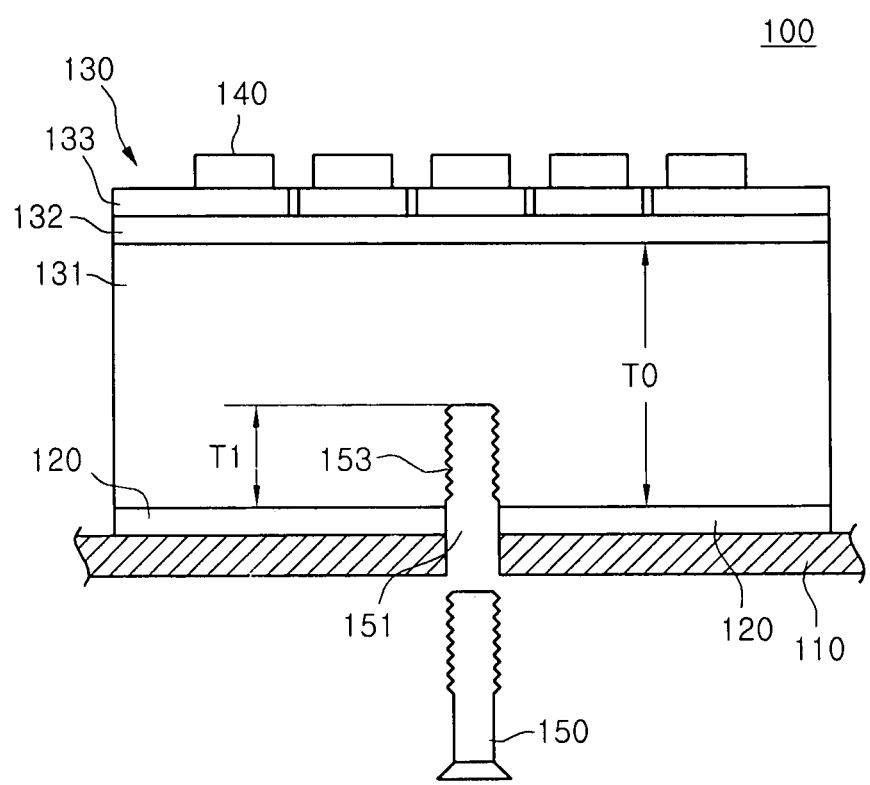
FIG. 1 is a sectional view showing a backlight unit according to the first embodiment.

FIG. 1 is a sectional view showing the backlight unit according to the first embodiment.

Referring to FIG. 1, the backlight unit 100 includes a bottom cover 110 that can protect internal components of the backlight unit 100 from external impact, a module substrate 130 on the bottom cover 110, and one or more light emitting diodes 140 on the module substrate 130.

A thermal pad 120 is positioned between the bottom cover 110 and the module substrate 130 to dissipate heat generated during operation of the light emitting diode 140.

A fastening unit 150 is coupled to the module substrate 130 which passes through the bottom cover 110. The fastening unit 150 fastens the module substrate 130 closely to the bottom cover 110, so that the module substrate 130 can be prevented from being deformed by heat. In addition, since a part of the fastening unit 150 is exposed to the outside, the fastening unit 150 may effectively dissipate heat of the module substrate 130.

The fastening unit 150 will be described later in more detail.

Meanwhile, the bottom cover 110 may have a recess to receive the module substrate 130, and an optical sheet and a display panel may be aligned with the bottom cover 110.

The bottom cover 110 not only protects the module substrate 130 from external impact, but also serves as a heat sink. The bottom cover 110 may include aluminum (Al), magnesium (Mg), zinc (Zn), titanium (Ti), tantalum (Ta), hafnium (Hf) or niobium (Nb), but the embodiment is not limited thereto.

The thermal pad 120 interposed between the module substrate 130 and the bottom cover 110 may include silicon and may be attached to the bottom cover 110 or the module substrate 130 to dissipate heat generated from the module substrate 130.

For instance, the thermal pad 120 is made of material having superior thermal conductivity to transfer the heat generated from the module substrate 130 to the bottom cover 110.

In addition, the thermal pad 120 may have a function of absorbing external impact such that the external impact can be prevented from being transferred to the module substrate 130 and the light emitting diode 140.

The module substrate 130 may be a printed circuit board (PCB) used to drive the light emitting diode 140, and includes an electric conductive layer 131, an insulating layer 132 and a metal plate 133. The electric conductive layer 131 includes aluminum having thickness of about 0.6 mm to 1.0 mm. The thickness T0 of the electric conductive layer 131 can be changed by taking into consideration the heat dissipation efficiency for the heat generated by the light emitting diode 140.

The insulating layer 132 is provided to electrically insulate the electric conductive layer 131 from the metal plate 133.

In addition, the metal plate 133 can be prepared as a circuit pattern and the light emitting diode 140 is mounted on the metal plate 133 to emit light. A plurality of light emitting diodes 140 can be provided in the form of an array. For instance, plural light emitting diodes 140 can be mounted on the metal plate 133 in the form of a chip or a package.

The shape or position of the module substrate 130 may deform or change due to the heat generated during the operation of the light emitting diode 140. If the shape of the module substrate 130 is deformed, quantity of light transferred to the display panel from the light emitting diode 140 may vary, thereby causing problems, such as hot spot.

In order to dissipate heat of the module substrate 130, the module substrate 130 adheres closely to the bottom cover 110, so that the heat transfer efficiency can be improved. In addition, since the thermal pad 120 is interposed between the module substrate 130 and the bottom cover 110, the heat dissipation efficiency can be improved.

In order to fasten the module substrate 130 closely to the bottom cover 110, the fastening unit 150 extends by passing through the bottom cover 110. One end of the fastening unit 150 is positioned in the electric conductive layer 131. Due to the fastening unit 150, the module substrate 130 may adhere closely to the bottom cover 110, and the heat of the module substrate 130 can be effectively dissipated. To this end, the fastening unit 150 may include a screw. In addition to the screw, the fastening unit 150 may include a hook, a link or forceps. For example, after forming a hole in the electric conductive layer, the hook, the link or the forceps is inserted into the hole to fasten the bottom cover 110 closely to the electric conductive layer 131.

Due to the fastening unit, the heat dissipation efficiency of the module substrate 130 can be improved without changing the structure of the backlight unit.

In the following description, the screw will be adopted as the fastening unit 150 for the purpose of convenience of explanation.

At least one fastening hole 151 is formed through the bottom cover 110, the thermal pad 120 and a lower portion of the electric conductive layer 131. The fastening hole 151 can be formed by laser processing, mechanical drilling or hot embossing.

A female screw 153 corresponding to the screw 150 is formed at an inner wall of the fastening hole 151 formed in the electric conductive layer 131. The fastening hole 151 formed in the electric conductive layer 131 may have depth T1 corresponding to ⅓ to ⅔ of thickness T0 of the electric conductive layer 131 such that the fastening hole 151 can be spaced apart from the metal plate 133 by a predetermined distance.

In addition, one end of the screw 150 serving as the fastening unit has a diameter larger than a diameter of the fastening hole 151 such that the one end of the screw 150 may be blocked by the bottom cover 110 when the screw 150 has been inserted into the fastening hole 151.

If the screw 150 is screwed into the fastening hole 151, the electric conductive layer 131 is biased toward the bottom cover 110, so that the electric conductive layer 131 is fixed to the bottom cover 110.

At this time, an insertion depth of the screw 150 can be adjusted by adjusting the depth T1 of the fastening hole 151. Preferably, the depth T1 of the fastening hole 151 is set such that the screw 150 does not electrically connect with the metal plate 133.

Since the module substrate 130 is fixedly fastened to the bottom cover 110, variation of the module substrate 130, such as delamination or twist, can be prevented so that variation of light quantity and hot spot can be reduced. In addition, since the module substrate 130 is fastened closely to the bottom cover 110, the heat dissipation efficiency can be improved.

Figure 2:
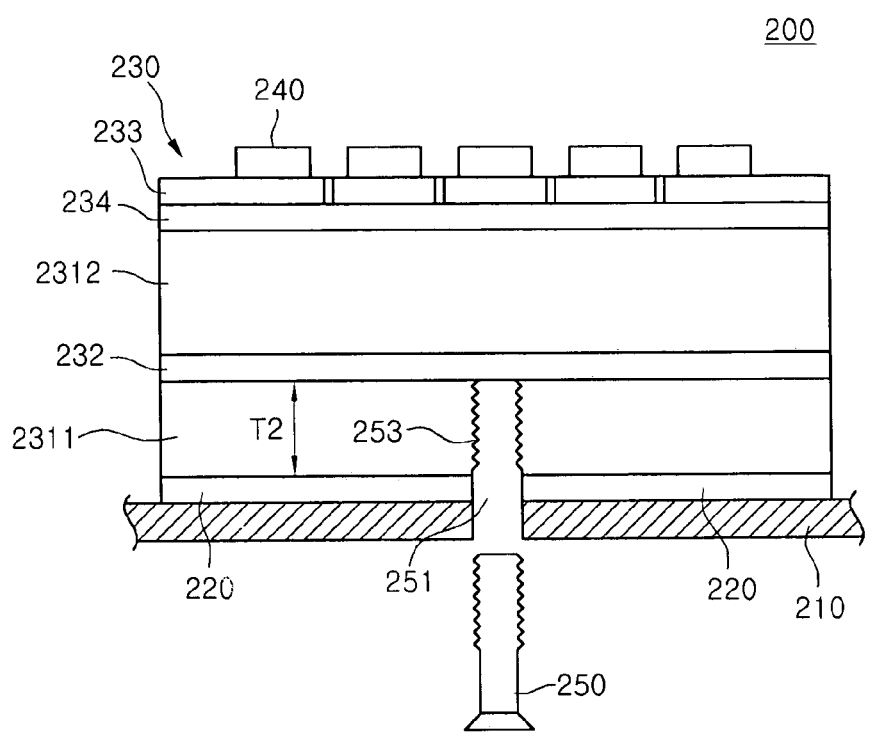
FIG. 2 is a sectional view showing a backlight unit according to the second embodiment.

FIG. 2 is a sectional view showing a backlight unit according to the second embodiment. The second embodiment will be described with reference to the first embodiment and the description about the same elements will be omitted in order to avoid redundancy.

Referring to FIG. 2, the backlight unit 200 includes a module substrate 233 having a plurality of electric conductive layers 2311 and 2312 and a plurality of insulating layers 232 and 234.

That is, the module substrate 230 includes a first electric conductive layer 2311, which is positioned at the bottom of the module substrate 230, a first insulating layer 232, a second electric conductive layer 2312, a second insulating layer 234 and a metal plate 234.

The first electric conductive layer 2311 makes contact with the thermal pad 220. The first insulating layer 232 includes insulating material for insulating between the first and second electric conductive layers 2311 and 2312 and the second insulating layer 234 is aligned on the second electric conductive layer 2312.

The first and second electric conductive layers 2311 and 2312 may include aluminum and the first insulating layer 232 is interposed between the first and second electric conductive layers 2311 and 2312. It should be noted that plural second electric conductive layers 2312 and second insulating layers 234 can be provided while being alternately stacked on each other, but the embodiment is not limited thereto.

The fastening hole 251 extends through the bottom cover 210, the thermal pad 220 and the first electric conductive layer 2311.

According to the second embodiment, a screw 250 is provided as a fastening unit to fasten the first electric conductive layer 2311 closely to the bottom cover 210. A fastening hole 251 for the screw 250 is formed in the first electric conductive layer 2311.

The fastening hole 251 is formed through the whole thickness T2 of the first electric conductive layer 2311, and a female screw 253, which corresponds to the screw 250, is formed in the first electric conductive layer 2311 such that the screw 250 can be fastened within the first electric conductive layer 2311. The first electric conductive layer 2311 may have thickness T2 in the range of about 0.6 mm to 1.0 mm.

The screw 250 is inserted into the fastening hole 251 of the bottom cover 210 and the thermal pad 220, and then fixedly fastened in the fastening hole 251 of the first electric conductive layer 2311 due to engagement between the screw 250 and the female screw 253. Thus, the bottom cover 210, the thermal pad 220 and the first electric conductive layer 2311 are integrally fastened by the screw 250, thereby fixing the module substrate 230. In addition, when the screw 250 is fastened, the first insulating layer 232 aligned on the first electric conductive layer 2311 can prevent the error during fastening.

Embodiments of the backlight unit have been described. A device having a liquid crystal display (LCD) where the LCD includes a backlight unit and an LCD panel are well known and will not be further described. The device may be a monitor, a television, and a mobile communication terminal.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A backlight unit comprising:
   a bottom cover;
   a module substrate on the bottom cover;
   at least one light emitting diode on the module substrate; and
   a fastening unit configured to fasten the module substrate to the bottom cover,
   wherein the module substrate includes an electric conductive layer on the bottom cover, an insulating layer on the electric conductive layer, and a metal plate between the insulating layer and the light emitting diode, wherein the fastening unit is fixed in the electric conductive layer by passing through the bottom cover.
2. The backlight unit of claim 1, wherein the bottom cover and the module substrate are formed with a fastening hole into which the fastening unit is inserted.

3. The backlight unit of claim 1, wherein the fastening unit is fixed in the module substrate by passing through the bottom cover.

4. The backlight unit of claim 1, wherein the bottom cover is formed with a fastening hole into which the fastening unit is inserted, the fastening unit includes a screw having one end configured to be blocked by the bottom cover when the screw has been inserted into the fastening hole, and a female screw corresponding to the screw is formed in the module substrate to engage with the screw.

5. The backlight unit of claim 1, further comprising a thermal pad between the bottom cover and the module substrate, wherein the fastening unit is fixed in the module substrate by passing through the bottom cover and the thermal pad.

6. The backlight unit of claim 5, wherein the thermal pad includes silicon.

7. The backlight unit of claim 1, wherein the fastening unit is inserted into the electric conductive layer by a depth corresponding to 1/3 to 2/3 of a thickness of the electric conductive layer.

8. The backlight unit of claim 1, wherein the fastening unit has an end positioned in the electric conductive layer.

9. The backlight unit of claim 1, wherein the fastening unit is one of a screw, a hook, a link, and a forceps.

10. The backlight unit of claim 1, wherein a thickness range of the electric conductive layer is from about 0.6 mm to 1.0 mm.

11. A device comprising:
a liquid crystal display (LCD) panel;
a backlight unit aligned with the LCD panel, the backlight unit including;
a bottom cover;
a module substrate on the bottom cover;
at least one light emitting diode on the module substrate; and
a fastening unit configured to fasten the module substrate to the bottom cover,
wherein the module substrate includes an electric conductive layer on the bottom cover, an insulating layer on the electric conductive layer, and a metal plate between the insulating layer and the light emitting diode, and the fastening unit is fixed in the electric conductive layer by passing through the bottom cover.

12. The device of claim 11, wherein the bottom cover and the module substrate are formed with a fastening hole into which the fastening unit is inserted.

13. The device of claim 11, wherein the fastening unit is fixed in the module substrate by passing through the bottom cover.

14. The device of claim 11, wherein the bottom cover is formed with a fastening hole into which the fastening unit is inserted, the fastening unit includes a screw having one end configured to be blocked by the bottom cover when the screw has been inserted into the fastening hole, and a female screw corresponding to the screw is formed in the module substrate to engage with the screw.

15. The device of claim 11, further comprising a thermal pad between the bottom cover and the module substrate, wherein the fastening unit is fixed in the module substrate by passing through the bottom cover and the thermal pad.

16. The device of claim 15, wherein the thermal pad includes silicon.

17. The device of claim 11, wherein the fastening unit is inserted into the electric conductive layer by a depth corresponding to 1/3 to 2/3 of a thickness of the electric conductive layer.

18. The device of claim 11, wherein the device includes one of a monitor, a television, and a mobile communication device.

19. The device of claim 11, wherein the fastening unit has an end positioned in the electric conductive layer.

20. The device of claim 11, wherein a thickness range of the electric conductive layer is from about 0.6 mm to 1.0 mm.

* * * * *